(12) United States Patent
Chen et al.

(10) Patent No.: US 6,392,888 B1
(45) Date of Patent: May 21, 2002

(54) HEAT DISSIPATION ASSEMBLY AND METHOD OF ASSEMBLING THE SAME

(75) Inventors: Yung Chou Chen; Che Cheng Lin; Hsueh Sheng Hsiao, all of Taipei (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/746,597

(22) Filed: Dec. 20, 2000

(30) Foreign Application Priority Data

Dec. 15, 2000 (TW) ........................................ 89126898 A

(51) Int. Cl.[7] ................................................. H05K 7/20
(52) U.S. Cl. ............... 361/704; 29/890.035; 219/56.22; 361/719; 361/816
(58) Field of Search ................... 29/832, 840, 890.035, 29/726; 361/704, 705, 709–712, 717–719, 687, 816, 703, 818; 165/80.3, 185; 174/16.3; 228/180.21, 183; 219/56.21, 56.22

(56) References Cited

U.S. PATENT DOCUMENTS

| 4,544,942 | A | * | 10/1985 | McCarthy | ................... | 257/721 |
|---|---|---|---|---|---|---|
| 5,241,453 | A | * | 8/1993 | Bright et al. | ................ | 361/704 |
| 5,566,052 | A | * | 10/1996 | Hughes | ....................... | 361/704 |
| 5,699,610 | A | * | 12/1997 | Shimada et al. | .............. | 29/840 |
| 6,061,240 | A | * | 5/2000 | Butterbaugh et al. | ........ | 361/704 |
| 6,125,038 | A | * | 9/2000 | Amaro et al. | ................ | 361/704 |
| 6,219,239 | B1 | * | 4/2001 | Mellberg et al. | ............. | 361/704 |
| 6,278,615 | B1 | * | 8/2001 | Brezina et al. | ............. | 361/799 |

* cited by examiner

Primary Examiner—Gerald Tolin
(74) Attorney, Agent, or Firm—Wei Te Chung

(57) ABSTRACT

A heat dissipation assembly comprises a printed circuit board (PCB) (20), a chip (30) and a heat sink (10). The PCB comprises a grounding circuit and four through apertures (22) in the grounding circuit. The chip is mounted on the PCB, and is surrounded by the through apertures. The heat sink has four metal columns (16) depending from a bottom surface of a base (12) thereof, the columns corresponding to the four through apertures. A method of assembling the heat dissipation assembly includes the steps of: mounting a chip on a PCB; inserting metal columns of a heat sink into corresponding through apertures of the PCB; and welding the metal columns in the through apertures so that the heat sink is in intimate thermal contact with an upper surface of the chip.

11 Claims, 3 Drawing Sheets

HEAT DISSIPATION ASSEMBLY AND METHOD OF ASSEMBLING THE SAME

BACKGROUND OF THE INVENTION

1. Field of the Invention

The present invention relates to a heat dissipation assembly and method of assembling the same, and more particularly to a heat dissipation assembly forming a grounding mechanism and a method for firmly attaching a heat sink to a printed circuit board and a chip.

2. Related Art

Many computer electronic devices such as chips and central processing units (CPUs) generate large amounts of heat. Excessive heat can adversely affect the stability and operation of a computer. Heat generated by a chip must be quickly removed therefrom. This is conventionally done by attaching a heat sink to the chip. Various kinds of clips, pins and adhesive tapes are used to closely attach a heat sink to a chip.

FIG. 3 shows a conventional heat dissipation assembly for attaching a heat sink 300 to a chip 500 which is mounted on a printed circuit board (PCB) 400. A heat sink 300 is attached to the chip 500 using pins 100 and springs 200. But retaining force exerted by the springs 200 is generally insufficient to firmly secure the heat sink 300 to the chip 500. This reduces the efficiency of heat removal.

In some systems, heat-conductive adhesive tape is used between a heat sink and a chip. But such tape is prone to age and lose stickiness. Thus the connection between the heat sink and the chip often becomes loose.

Furthermore, with the development of high-speed chips, generation of electromagnetic interference (EMI) is becoming an increasingly serious problem. Conventional heat dissipation assemblies do not address this problem.

Thus an improved heat dissipation assembly and a method of assembling the same which overcome the problems of the related art are desired.

SUMMARY OF THE INVENTION

Accordingly, an object of the present invention is to provide a method for firmly attaching a heat sink to a printed circuit board (PCB) and a chip.

Another object of the present invention is to provide a heat dissipation assembly having a grounding mechanism for reducing electromagnetic interference (EMI).

To achieve the above objects, a heat dissipation assembly in accordance with the present invention comprises a PCB, a chip and a heat sink. The PCB comprises a grounding circuit, and four through apertures in the grounding circuit. The chip is mounted on the PCB, and is surrounded by the through apertures. The heat sink has four metal columns depending from a bottom surface of a base thereof, the columns corresponding to the four through apertures. A method of assembling the heat dissipation assembly includes the steps of: mounting a chip on a PCB; inserting metal columns of a heat sink into corresponding through apertures of the PCB; and welding the metal columns in the through apertures so that the heat sink is in intimate thermal contact with an upper surface of the chip.

DETAILED DESCRIPTION OF THE PREFERRED EMBODIMENT

Figure 1:
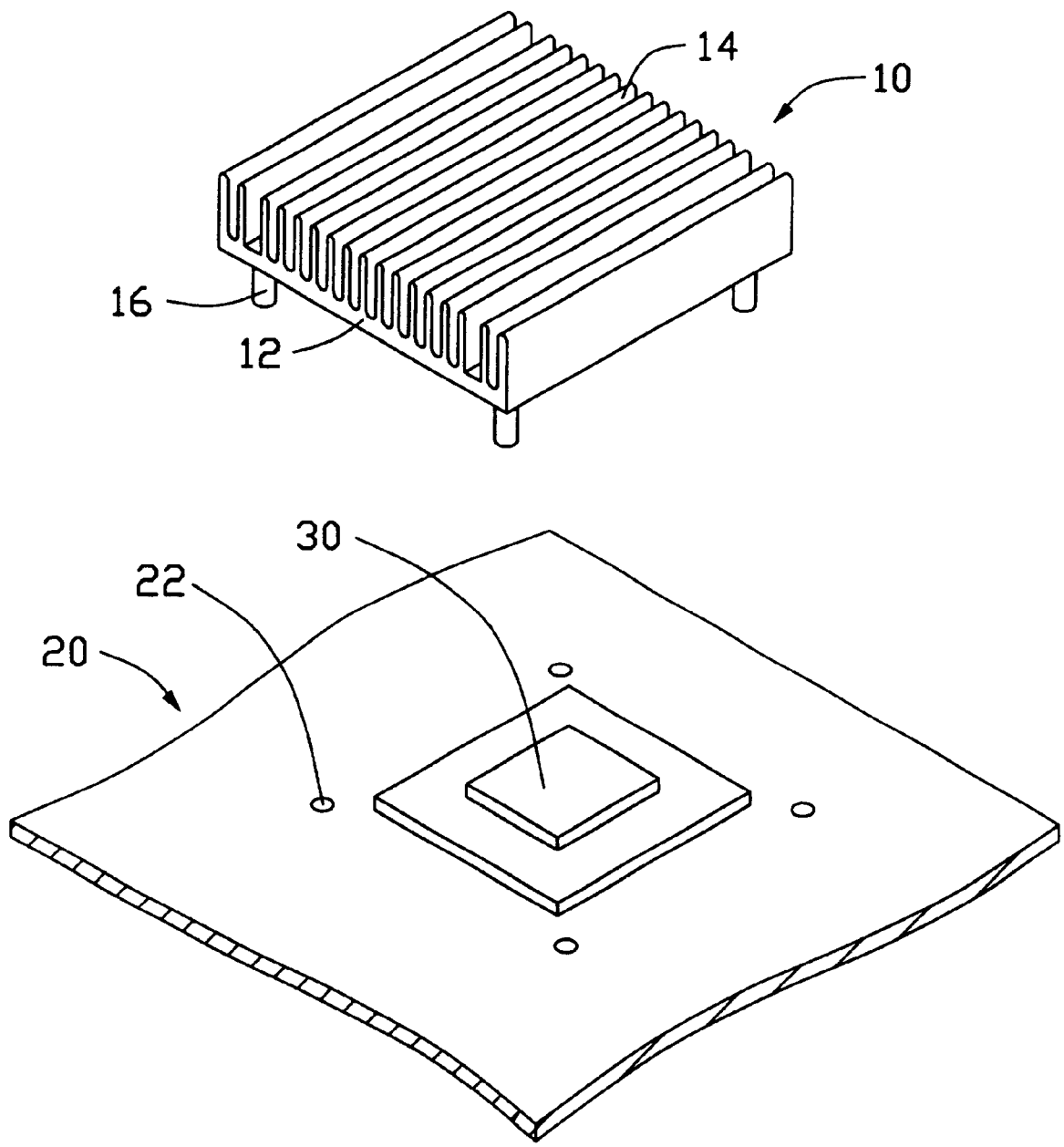
FIG. 1 is an exploded view of a heat dissipation assembly of the present invention.

Referring to FIG. 1, a heat dissipation assembly of the present invention comprises a printed circuit board (PCB) 20, a chip 30 and a heat sink 10. The PCB 20 comprises a grounding circuit (not shown). The PCB 20 defines four through apertures 22 in the grounding circuit, the apertures being arranged in a rectangular formation. The chip 30 is mounted onto a center portion of the PCB 20, and is surrounded by the four through apertures 22. The heat sink 10 comprises a base 12, and a plurality of fins 14 extending upwardly from the base 12. Four columns 16 depend from a bottom surface of the base 12, corresponding to the four through apertures 22. The columns 16 are made of metal.

Figure 2:
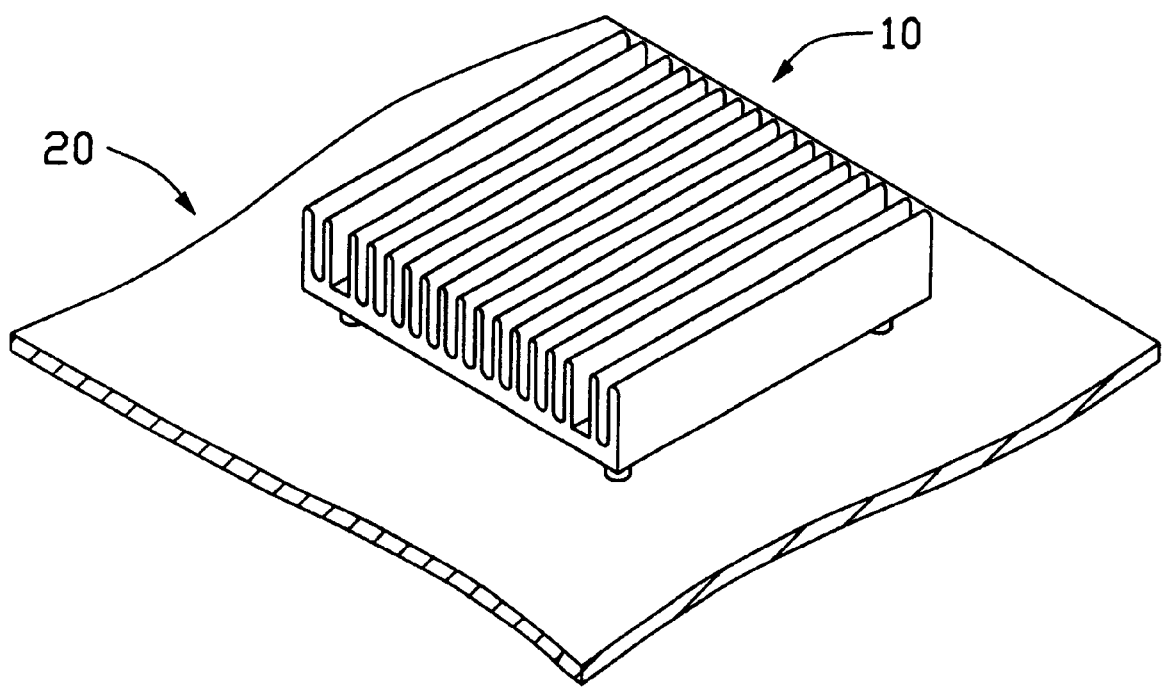
FIG. 2 is an assembled view of FIG. 1.
Figure 3:
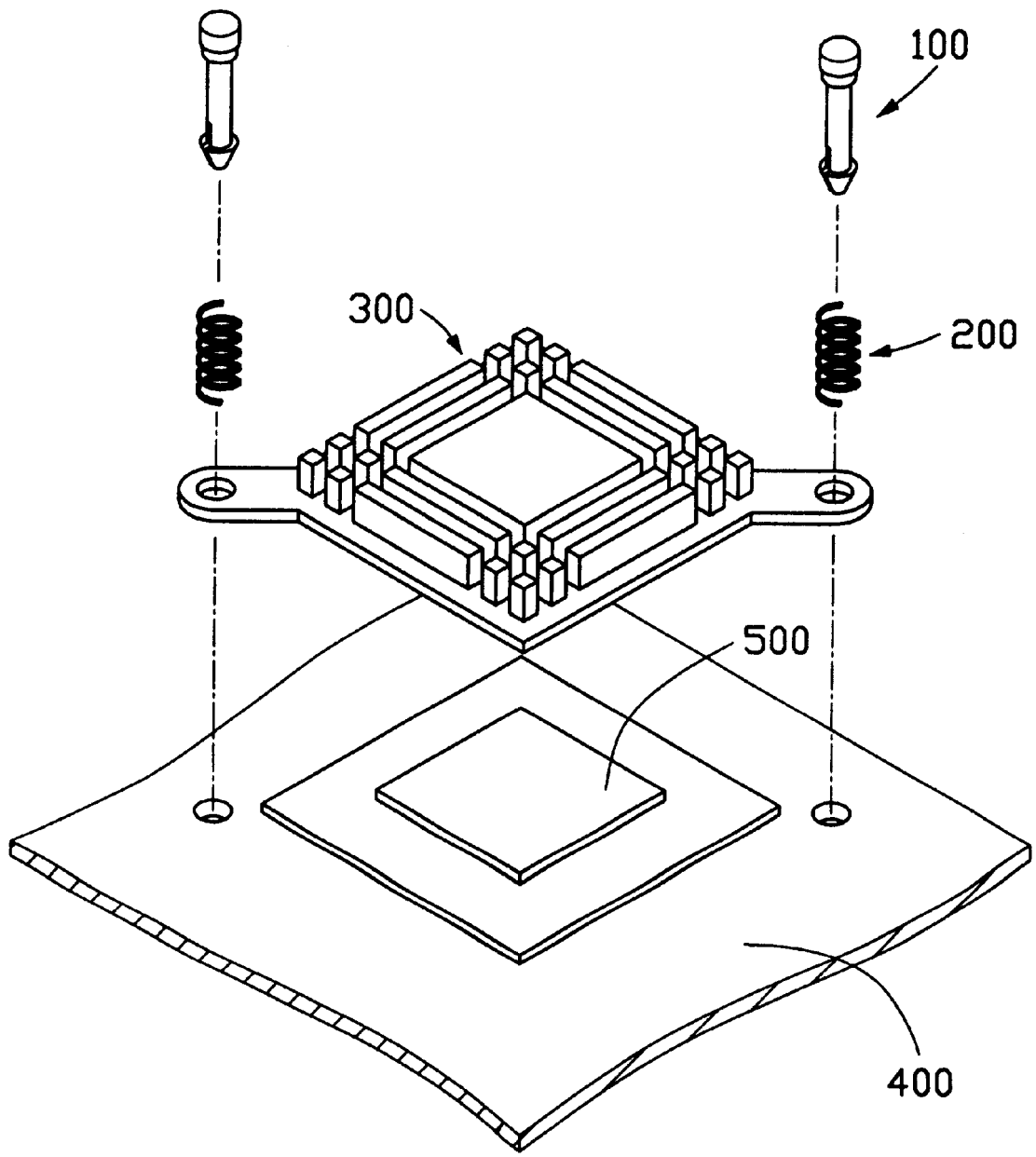
FIG. 3 is an exploded view of a conventional heat dissipation assembly.

Referring also to FIG. 2, in assembly, the columns 16 of the heat sink 10 are inserted into the through apertures 22 of the PCB 20, and are welded in the through apertures 22 with soldering tin (not shown). The heat sink 10 is thereby in intimate thermal contact with an upper surface of chip 30. The columns 16 are thus electrically connected to the grounding circuit of the PCB, so that the grounding circuit and the heat sink 10 together form a grounding mechanism for reducing electromagnetic interference (EMI) generated from the PCB 20.

Because the present invention uses the technique of welding, the connection between the heat sink 10 and the PCB 20 is very firm and durable. Another advantage of welding is that the grounding mechanism thereby formed by the heat sink 10 and the grounding circuit of the PCB 20 reduces EMI.

A method of assembling the heat dissipation assembly comprises the steps of: mounting a chip on a PCB; inserting metal columns of a heat sink into corresponding through apertures of the PCB; and welding the metal columns in the through apertures so that the heat sink is in intimate thermal contact with an upper surface of the chip.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat dissipation assembly comprising:
   a printed circuit board having a grounding circuit and a plurality of through apertures in the grounding circuit;
   a chip mounted on the printed circuit board, the chip being surrounded by the through apertures of the printed circuit board; and
   a heat sink attached to the chip, the heat sink comprising a base and a plurality of columns depending from the base, the base being in intimate thermal contact with the chip, the columns being welded in the corresponding through apertures of the printed circuit board with soldering tin to thereby firmly connect the heat sink and the printed circuit board together and being connected to the grounding circuit of the printed circuit board.

2. The heat dissipation assembly as recited in claim 1, wherein the columns respectively depend from each of four corners of a bottom surface of the base, and the printed circuit board has four corresponding through apertures.

3. The heat dissipation assembly as recited in claim 1, wherein the columns and the heat sink are made separately, and the columns are embedded in the base of the heat sink.

4. The heat dissipation assembly as recited in claim 1, wherein the printed circuit board has four through apertures arranged in a rectangular formation.

5. The heat dissipation assembly as recited in claim 1, wherein the heat sink further comprises a plurality of fins extending upwardly from an upper surface of the base.

6. A heat sink comprising:

a rectangular base;

a plurality of fins extending upwardly from the base; and four metal columns depending from four corners of the base respectively, wherein the columns are received in corresponded through apertures in a grounding circuit of a printed circuit board, and are welded in the through aperture of the printed circuit board, whereby the heat sink and the printed circuit board are firmly connected together.

7. A method of assembling a heat dissipation assembly, comprising the steps of:

providing a printed circuit board, the printed circuit board having a grounding circuit and a plurality of through apertures in the grounding circuit;

mounting a chip on the printed circuit board so that the chip is surrounded by the through apertures;

attaching a heat sink to the chip, the heat sink comprising a base and a plurality of metal columns depending from the base, the columns of the heat sink being inserted into the corresponding through apertures of the printed circuit board; and welding the metal columns of the heat sink in the through apertures of the printed circuit board so that the heat sink is in intimate thermal contact with an upper surface of the chip, and the heat sink and the printed circuit board are firmly connected together.

8. The method of assembling the heat dissipation assembly as recited in claim 7, wherein the columns respectively depend from each of four corners of a bottom surface of the base, and the printed circuit board has four corresponding through apertures.

9. The method of assembling the heat dissipation assembly as recited in claim 7, wherein the columns and the heat sink are made separately and the columns are embedded in the base of the heat sink.

10. The method of assembling the heat dissipation assembly as recited in claim 7, wherein the printed circuit board has four through apertures arranged in a rectangular formation.

11. The method of assembling the heat dissipation assembly as recited in claim 7, wherein the heat sink further comprises a plurality of fins extending upwardly from an upper surface of the base.

* * * * *